US007008861B2

(12) United States Patent
Andrews et al.

(10) Patent No.: US 7,008,861 B2
(45) Date of Patent: Mar. 7, 2006

(54) SEMICONDUCTOR SUBSTRATE ASSEMBLIES AND METHODS FOR PREPARING AND DICING THE SAME

(75) Inventors: Peter Andrews, Durham, NC (US); Elbert Brown, Cary, NC (US); Gerald H. Negley, Hillsborough, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/733,845

(22) Filed: Dec. 11, 2003

(65) Prior Publication Data
US 2005/0130390 A1    Jun. 16, 2005

(51) Int. Cl.
*H01L 21/301* (2006.01)
*H01L 23/00* (2006.01)
(52) U.S. Cl. ............................. 438/463; 257/620
(58) Field of Classification Search ................ 438/460, 438/463; 257/618, 620
See application file for complete search history.

(56) References Cited

U.S. PATENT DOCUMENTS

| | | | |
|---|---|---|---|
| 3,626,141 A * | 12/1971 | Daly | 219/121.68 |
| 3,816,700 A * | 6/1974 | Weiner et al. | 219/121.68 |
| 3,970,819 A * | 7/1976 | Gates et al. | 219/121.69 |
| 4,325,182 A | 4/1982 | Tefft et al. | |
| 4,355,457 A * | 10/1982 | Barlett et al. | 438/460 |
| 4,966,862 A | 10/1990 | Edmond | |
| 5,185,295 A * | 2/1993 | Goto et al. | 438/463 |
| 5,429,954 A | 7/1995 | Gerner | |
| 5,543,365 A * | 8/1996 | Wills et al. | 438/462 |
| 5,631,190 A | 5/1997 | Negley | 438/33 |
| 5,912,477 A | 6/1999 | Negley | 257/95 |
| 5,916,460 A | 6/1999 | Imoto et al. | 219/121.67 |

(Continued)

FOREIGN PATENT DOCUMENTS

| | | |
|---|---|---|
| DE | 19624671 A1 | 1/1998 |
| JP | 09270528 | 10/1997 |
| JP | 2003338636 | 11/2003 |
| WO | WO 02/37578 A1 | 5/2002 |
| WO | WO 03/030271 A2 | 4/2003 |
| WO | WO 03/010817 A2 | 6/2003 |

OTHER PUBLICATIONS

J. Han et al., "Blue/Green Lasers Focus on the Market", 1994 IEEE, Circuits and Devices, pp. 18-23.*
Lizotte, "Laser Dicing of Chip Scale and Silicon Wafer Scale Packages", Jul. 2003, Electronics Manufacturing Technology Symposium, pp. 1-5.*
U.S. Appl. No. 10/610,329, titled *Trench Cut Light Emitting Diodes and Methods of Fabricating the Same*, inventors Bruhns et al., filed Jun. 30, 2003.

(Continued)

*Primary Examiner*—Evan Pert
(74) *Attorney, Agent, or Firm*—Myers Bigel Sibley & Sajovec, P.A.

(57) ABSTRACT

A method for forming semiconductor devices using a semiconductor substrate having first and second opposed surfaces and including first and second device regions includes directing a beam of laser light at the substrate such that the beam of laser light is focused within the substrate between the first and second surfaces thereof and the beam of laser light forms a thermally weakened zone (TWZ) in the substrate. The TWZ extends between the first and second device regions and defines a break line.

60 Claims, 15 Drawing Sheets

U.S. PATENT DOCUMENTS

| | | |
|---|---|---|
| 5,923,053 A | 7/1999 | Jakowetz et al. |
| 5,923,946 A | 7/1999 | Negley .......................... 438/4 |
| 6,211,488 B1 * | 4/2001 | Hoekstra et al. ....... 219/121.72 |
| 6,413,839 B1 | 7/2002 | Brown et al. ............... 438/463 |
| 6,580,054 B1 | 6/2003 | Liu et al. ............... 219/121.68 |
| 6,653,210 B1 * | 11/2003 | Choo et al. ................. 438/460 |

OTHER PUBLICATIONS

*Notification of Transmittal of the International Search Report and the Written Opinion of the International Searching Authority, or the Declaration* for PCT/US2004/034384, mailed Feb. 7, 2005.

* cited by examiner

SEMICONDUCTOR SUBSTRATE ASSEMBLIES AND METHODS FOR PREPARING AND DICING THE SAME

FIELD OF THE INVENTION

The present invention relates to fabrication of semiconductor devices and, more particularly, to dicing semiconductor wafers into individual components.

BACKGROUND OF THE INVENTION

Semiconductor devices are typically fabricated on a substrate that provides mechanical support for the device and often contributes to the electrical performance of the device as well. Silicon, germanium, gallium arsenide, sapphire and silicon carbide are some of the materials commonly used as substrates for semiconductor devices. Many other materials are also used as substrates. Semiconductor device manufacturing typically involves fabrication of many semiconductor devices on a single substrate.

Substrates are typically formed in the shape of circular wafers having a diameter presently ranging, for example, from less than 1 inch (2.54 cm) to over 12 inches (30.5 cm) depending on the type of material involved. Other shapes such as, for example, square, rectangular or triangular wafers are possible, however. Semiconductor devices are formed on the wafers by the precise formation of thin layers of semiconductor, insulator and metal materials which are deposited and patterned to form useful semiconductor devices such as diodes, transistors, solar cells and other devices.

Individual semiconductor devices are typically extremely small compared to the size of the wafer on which they are formed. For example, a typical light emitting diode (LED) chip such as the C430-XB290 LED chip manufactured by Cree, Inc., in Durham, N.C. measures only about 290 microns by 290 microns square (1 micron=0.0001 cm). Accordingly, a very large number of LED chips (also referred to as "die") may be formed on a single 2 inch (5.08 cm) diameter silicon carbide (SiC) wafer. After the die are formed on the wafer, it is necessary to separate at least some of the individual die so that they can be mounted and encapsulated to form individual devices. The process of separating the individual die is sometimes referred to as "dicing" or "singulating" the wafer.

Dicing a wafer into individual semiconductor devices may be accomplished by a number of methods. One method of dicing a wafer involves mounting the wafer on an adhesive surface and sawing the wafer with a circular saw to form a number of individually diced, square or rectangular shaped devices. Other methods of dicing include "scribe-and-break" techniques. In these methods, one or more trenches or scribe lines are formed in a surface of the wafer using a saw or ablation by laser. The wafer is then subjected to a load sufficient to break the wafer into individual dice. The scribe lines present lines of weakness in the wafer so that the wafer breaks along the scribe lines.

Singulation considerations may be particularly significant in the manufacture of light emitting diodes (LEDs). LEDs are widely used in consumer and commercial applications. As is well known to those having skill in the art, a light emitting diode generally includes a diode region on a microelectronic substrate. The microelectronic substrate may comprise, for example, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent lamp. GaN-based light emitting diodes (LEDs) typically comprise an insulating, semiconducting or conducting substrate such as sapphire or SiC on which a plurality of GaN-based epitaxial layers are deposited. The epitaxial layers comprise an active region having a p-n junction that emits light when energized.

SUMMARY OF THE INVENTION

According to embodiments of the present invention, a method for forming semiconductor devices using a semiconductor substrate having first and second opposed surfaces and including first and second device regions includes directing a beam of laser light at the substrate such that the beam of laser light is focused within the substrate between the first and second surfaces thereof and the beam of laser light forms a thermally weakened zone (TWZ) in the substrate. The TWZ extends between the first and second device regions and defines a break line. The method may further include breaking the substrate along the break line to form first and second dice, the first die including the first device region of the substrate and the second die including the second device region of the substrate.

According to further embodiments of the present invention, a semiconductor substrate assembly includes a semiconductor substrate having first and second opposed surfaces and including first and second device regions and a connecting portion extending between and joining the first and second device regions. A thermally weakened zone (TWZ) is located within the connecting portion and between the first and second surfaces. The TWZ extends between the first and second device regions and defines a break line. The first and second device regions are separable to form first and second dice by breaking the substrate along the break line. The TWZ has a depth into the connecting portion of at least 50% of a thickness of the connecting portion.

According to further embodiments of the present invention, a semiconductor substrate assembly includes a semiconductor substrate having first and second opposed surfaces and including first and second device regions. A thermally weakened zone (TWZ) is located within the substrate between the first and second surfaces. The TWZ extends between the first and second device regions and defines a break line. A fully ablated ablation trench is defined in a surface of the substrate and extends along the break line. The ratio of the combined depth of the ablation trench and the TWZ into the substrate to the greater of the maximum width of the TWZ and the maximum width of the ablation trench is at least 1:1. The first and second device regions are separable to form first and second dice by breaking the substrate along the break line.

According to further embodiments of the present invention, a semiconductor substrate assembly includes a semiconductor substrate having first and second opposed surfaces and including first and second device regions. A thermally weakened zone (TWZ) is located within the substrate between the first and second surfaces. The TWZ extends between the first and second device regions and defines a break line. The TWZ has a TWZ depth into the substrate and a TWZ maximum width across the substrate, and the ratio of the TWZ depth to the TWZ maximum width is at least 1:1. The first and second device regions are separable to form first and second dice by breaking the substrate along the break line.

Objects of the present invention will be appreciated by those of ordinary skill in the art from a reading of the figures and the detailed description of the preferred embodiments which follow, such description being merely illustrative of the present invention.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS OF THE INVENTION

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. As will also be appreciated by those of skill in the art, references herein to a layer formed "on" a substrate or other layer may refer to the layer formed directly on the substrate or other layer or on an intervening layer or layers formed on the substrate or other layer. Accordingly, the present invention is not limited to the relative size and spacing illustrated in the accompanying figures.

As used herein, the term "semiconductor wafer" refers to a wafer having at least one region of semiconductor material irrespective of whether a substrate of the wafer itself is a semiconductor material. For example, a layer of semiconductor material may be provided on a non-semiconductor material substrate to provide a semiconductor wafer. Furthermore, as used herein, the term "wafer" refers to a complete wafer or a portion of a wafer. Thus, the term wafer may be used to describe an entire wafer or part thereof, for example, if a complete wafer is broken in fabrication such that only a portion of the wafer remains usable or if different devices are fabricated on the wafer and the wafer is separated into different device portions prior to those portions being diced into individual devices.

Figure 1:
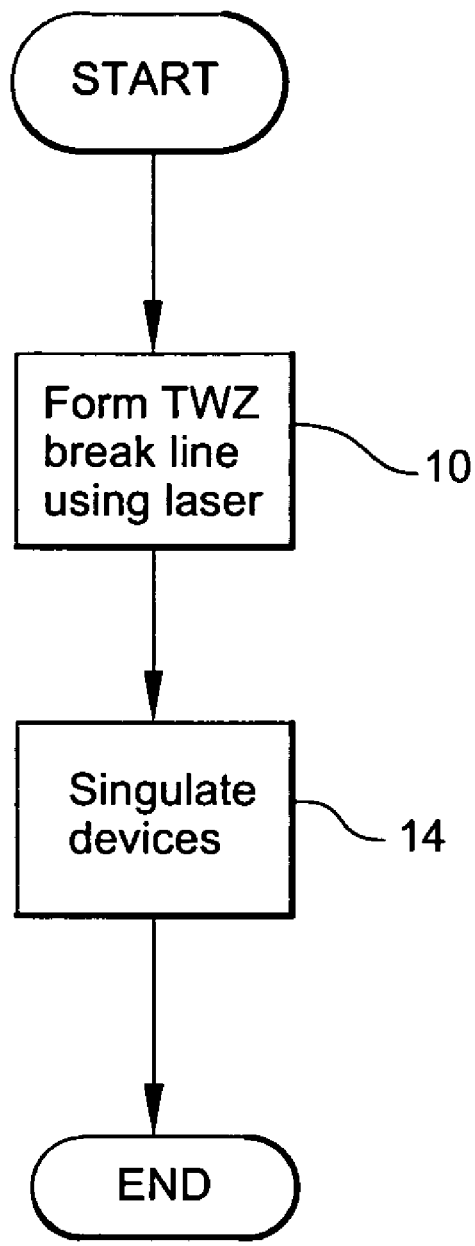
FIG. 1 is a flow chart illustrating processing steps in the fabrication of devices according to embodiments of the present invention.

With reference to FIG. 1, in accordance with methods of the present invention, multiple semiconductor devices formed on the same semiconductor wafer are separated from one another in the following manner. A beam of laser light from a laser is directed into the wafer such that a suitable amount of thermally weakened zone (TWZ) is created in the wafer between the devices (Block 10). The beam of laser light is directed in such a manner that the TWZ so formed defines a break line extending between and along the adjacent edges of the devices. The devices are thereafter singulated by breaking the wafer along the break line (Block 14). Such singulation may be accomplished using any suitable means or method. For example, the singulation may be effected by applying mechanical stresses in the wafer along the break line.

With reference to FIGS. 2–6, more particular methods for singulating semiconductor devices will now be described. A device layer including active device portions 122 is formed on a device surface 114 of a semiconductor substrate or wafer 110 (Block 20). According to some embodiments, the substrate 110 is formed of silicon carbide (SiC). The device portions 122 cover respective regions 112 of the substrate 110. Where the intended devices are LEDs, for example, the device portions 122 may include Group III nitrides, such as GaN based layers.

Figure 5:
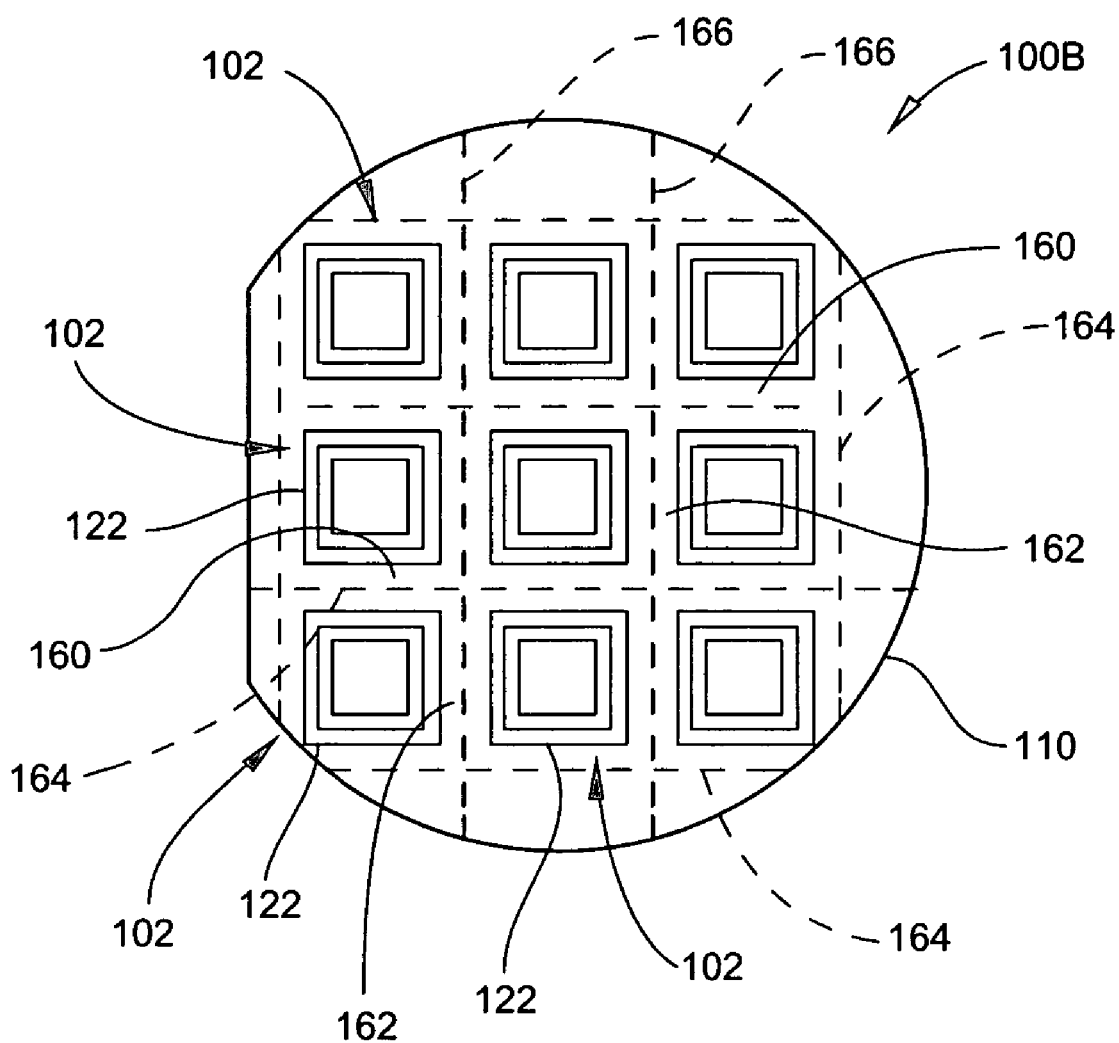
FIG. 5 is a top plan view of the substrate assembly of FIG. 4.

The device layer is etched to form isolation trenches 132, which in turn define mesas (Block 22). The devices may be isolated by a method other than mesa etching such as by ion implantation as described in U.S. Provisional Patent Application Ser. No. 60/320,182, filed May 9, 2003, which is incorporated herein by reference. Each mesa includes a respective active device portion 122. The device portions 122 are thereby separated by streets 160, 162 (FIG. 5). According to some embodiments, the device layer is etched fully down to the surface 114 of the substrate 110 so that an exposed strip 114A of the surface 114 defines each street 160, 162. Each of the device portions 122 may consist of a single device, such as an LED, or may include a plurality of devices, such as a group of LEDs.

Figure 3:
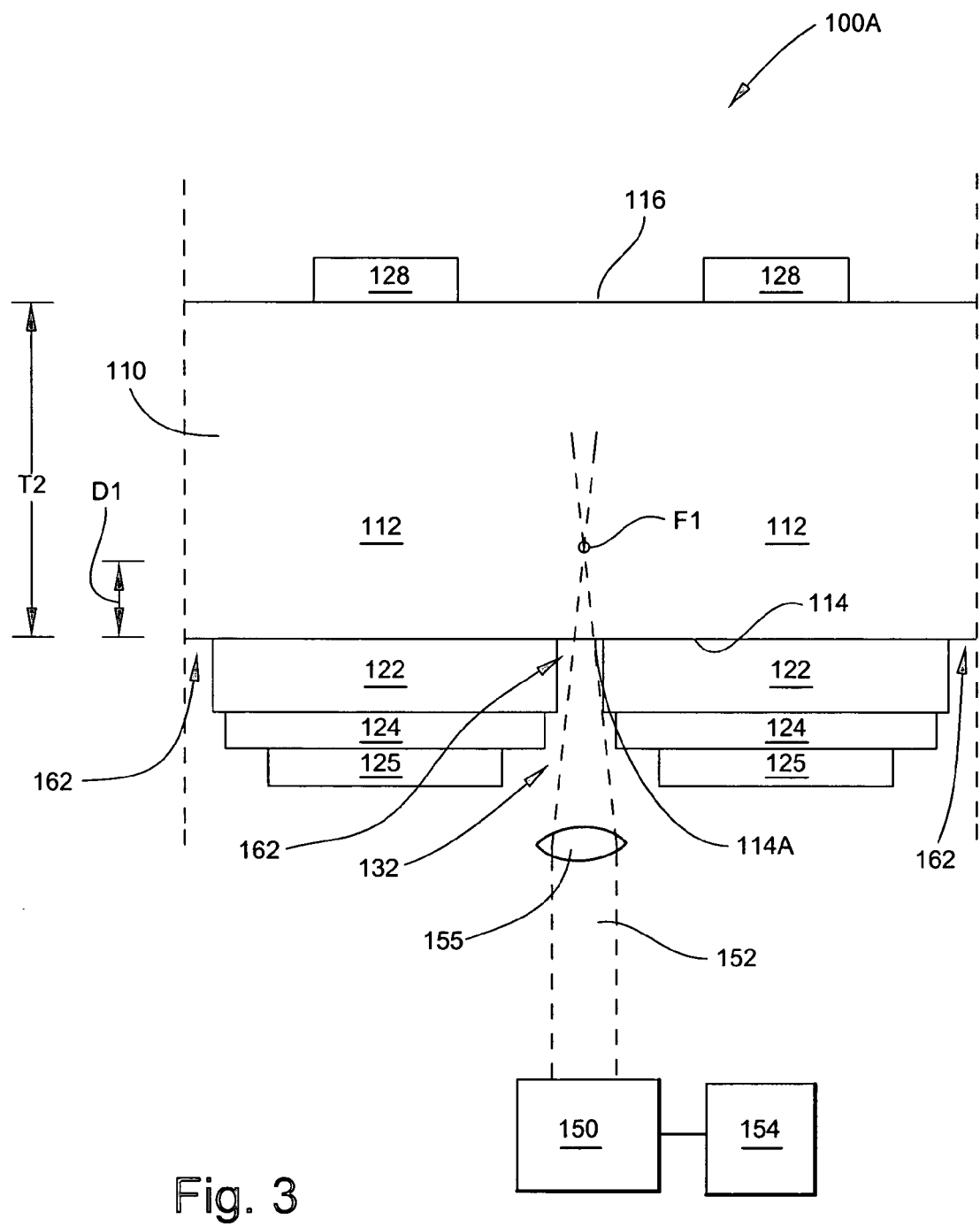
FIG. 3 is a schematic illustration of a portion of a substrate assembly, a laser, a laser beam, and a control apparatus according to embodiments of the present invention.

Contacts 124 and 128 are formed on the resulting mesas (Block 24) and in corresponding locations on a shaping surface 116 (opposite the device surface 114) of the substrate 110, as shown in FIG. 3. Eutectic contacts 126 are formed on the contacts 124, as also shown in FIG. 3 (Block 26).

In the foregoing manner, an intermediate substrate assembly 100A as shown in FIG. 3 is formed. A beam of laser light 152 from a laser 150 is directed into the wafer 110 of the substrate assembly 100A to create lines of TWZ 156A (FIG. 4) therein, thereby creating the aforementioned break lines 164, 166 (Block 30; FIG. 5). The laser beam 152 is converged and focused by a lens 155. The laser beam 152 is scanned (by relatively moving the laser 150, the substrate assembly 100A, or both) across the wafer 110 between the device portions 122 such that the laser beam 152 projects through the isolation trenches 132 and along each street 160, 162. In this manner, the break lines 164, 166 may be formed in a pattern so as to be substantially coextensive and aligned with the streets 160, 162 as shown in FIG. 5. A control apparatus 154 may be provided to control the operation of the laser 150 and the relative movement between the laser beam 152 and the substrate assembly 100A.

During the above-described scanning operations, the laser beam 152 is generated such that its focus F1 is located within the substrate 110 between the surfaces 114, 116 as illustrated in FIG. 3. According to some embodiments, the depth of focus D1 (measured from the device side surface 114) of the laser beam 152 is substantially uniform across the width of the substrate 110.

In this manner, a substantial amount of TWZ 156A (FIG. 4) is created in the substrate 110 along the streets 160, 162, without ablating the surface 114 or with only a limited amount of ablation of the surface 114. The TWZ 156A serves to mechanically weaken the material of the substrate 110 within the TWZ 156A. Thus, the portions of the substrate 110 separated by the break lines 164, 166 remain bound together by the TWZ 156A; however, the bond or connection is weakened.

The TWZ 156A may extend between the surfaces 114, 116 of the substrate 110. The TWZ 156A may include internal ablation, that is, ablation of substrate material within or between the surfaces 114, 116 of the substrate 110 such that the surfaces from which the material has been ablated remain within or between the surfaces of the substrate. The ablated material may escape from between the surfaces 114, 116 of the substrate or may redeposit or flow to relocate and remain within the substrate. The TWZ may include heat affected zone (HAZ). The TWZ may include portions of the substrate that have had their morphologies or crystal structures altered, damaged or modified by the laser so as to be weakened in at least one plane. The ablation mechanism may include melting or vaporizing of single crystalline SiC, vaporization of crystal boundaries, and/or the generation of defects in the crystal boundaries. As discussed above and below, the outer surface 114 may also be ablated. That is, material may be fully ablated from the outer surface such that the material is removed and the remaining surface defines a trench or void that is open to the surface (referred to herein as "surface ablation" or "ablation of the surface").

According to some embodiments, ablation of the surface 114A is minimized to the extent feasible while providing sufficient TWZ to allow suitable weakening of the substrate 110. According to some embodiments, the TWZ 156A of the break lines 164, 166 is created while causing substantially no ablation of the substrate surface 114A. As discussed below, in accordance with further embodiments, some ablation of the surface 114A may be permitted or intended.

According to some embodiments, the depth of focus D1 (measured from the device side surface 114) of the laser beam 152 is between about 0 and 30 $\mu$m. More particularly, the depth of focus D1 may be between about 20 and 30 $\mu$m. According to some embodiments, the depth of focus D1 is between about 40 and 60% of the thickness T1 of connecting portions 111 (FIG. 4) of the substrate 110 between the substrate regions 112 at the time of the singulation step.

According to some embodiments, the TWZ 156A has a maximum width H (measured across a cross-sectioned plane orthogonal to the length of the associated break line 164, 166) of at least 5 $\mu$m. According to some embodiments, the maximum width H is between about 5 and 30 $\mu$m. According to some embodiments, the maximum width H of each TWZ 156A is substantially uniform along the length of the associated break line 164, 166. According to some embodiments, the depth I of the TWZ 156A is at least 5 $\mu$m. According to some embodiments, the depth I is between about 5 and 30 $\mu$m. According to some embodiments, the depth I is at least 50% of the thickness T1 of the connecting portions 111 and, according to more particular embodiments, at least 95%. According to some embodiments, the TWZ 156A extends fully through the full thickness of the substrate 110 (i.e., to the far surface 116A). According to some embodiments, the depth I is between about 95 and 99% of the thickness T1 to prevent heat from the laser from burning through the support tape.

Figure 4:
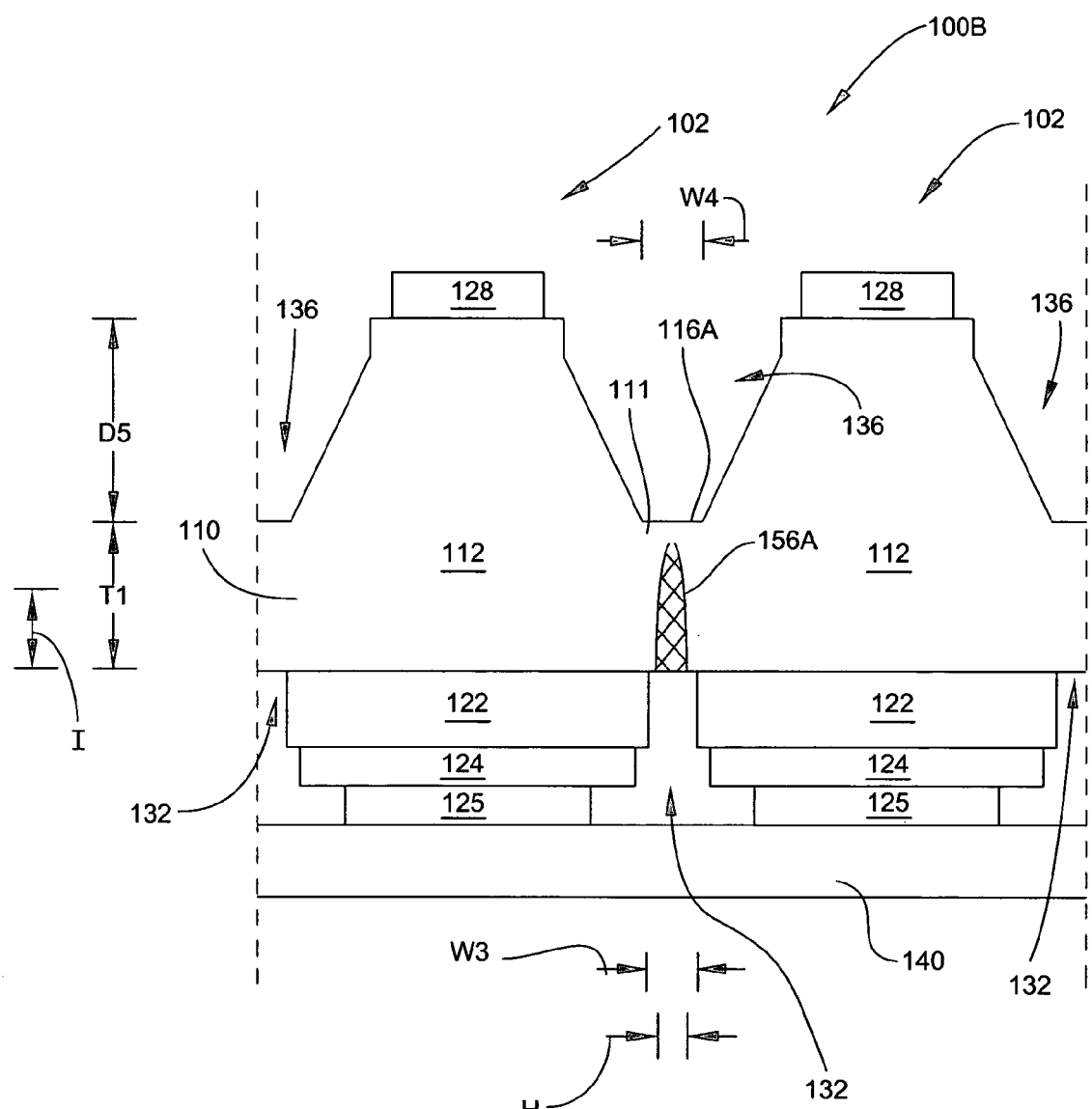
FIG. 4 is a schematic illustration of a portion of a further substrate assembly according to embodiments of the present invention.

Optionally, the side of the substrate 110 opposite the device portions 122 is shaped to form shaping trenches 136, and thereby a shaped substrate assembly 100B (Block 32; FIG. 4). The shaping trenches 136 may be diced, sawn, etched, water sawn, laser scribed or created using any other suitable method. For example, a saw blade may be used to cut lines in the substrate 110 to define the shape of a truncated pyramid with a cubic portion on top. In accordance with some embodiments, the substrate assembly 100A is mounted on an adhesive surface (e.g., adhesive tape) 140 (FIG. 4) during the step of shaping the substrate 110.

The pattern of the shaping trenches 136 across the substrate 110 may be the same as that of the break lines 164, 166. According to some embodiments, the shaping trenches 136 are parallel to, and may be aligned with, respective ones of the break lines 164, 166. According to some embodiments, the shaping trenches 136 are coextensive with the break lines 164, 166.

Figure 6:
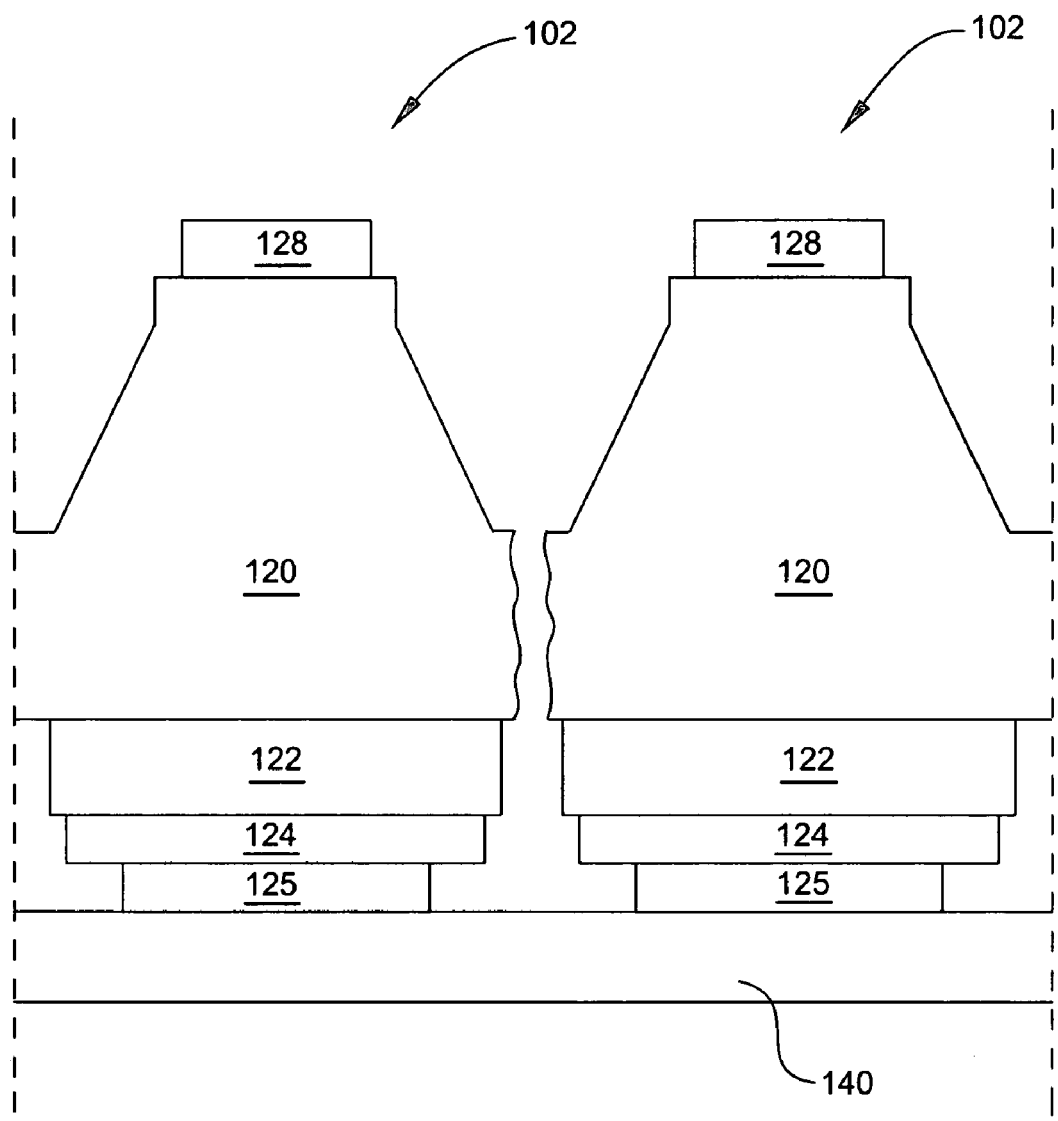
FIG. 6 is a schematic illustration of a pair of die that have been singulated from the substrate assembly of FIGS. 4 and 5.

The shaped substrate assembly 100B (or the unshaped substrate assembly 100A, in the case where the shaping step is omitted) is thereafter singulated by breaking, cracking or sawing the substrate 110 along the break lines 164, 166 (Block 34), as shown in FIG. 6. In this manner, multiple dice are formed. Each die includes a respective chip 102 (FIG. 4), which may be, for example, an LED chip. Each chip 102 includes a respective one of the device layers 122, its associated contacts 124, 126, 128 and the respective substrate region 112 on which it is mounted. The substrate assembly 100B may be broken using any suitable apparatus and method for applying a mechanical stress along the break lines 164, 166, such as a roller. The adhesive surface 140 may be stretched to separate the die from one another, and a pick and place apparatus may be used to remove the die from the adhesive surface 140.

Figure 7:
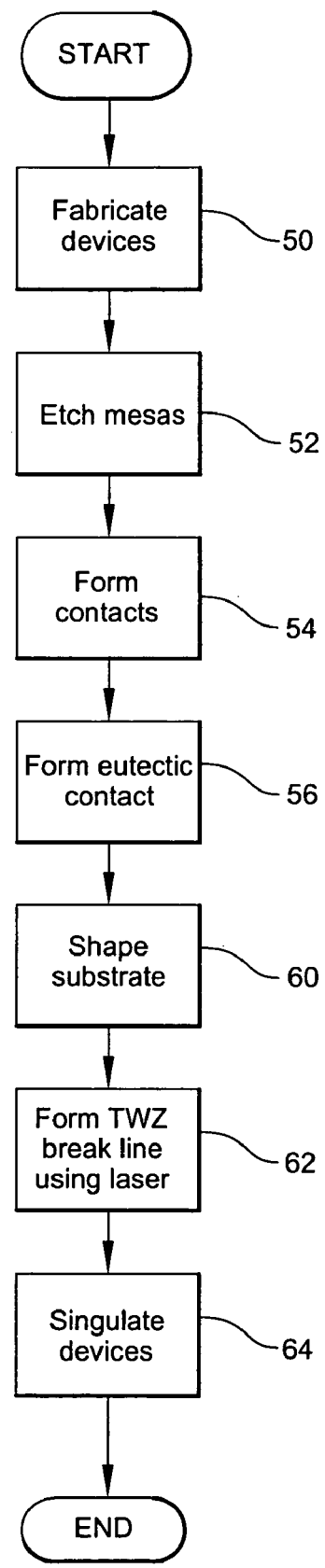
FIG. 7 is a flow chart illustrating processing steps in the fabrication of devices according to embodiments of the present invention.
Figure 8:
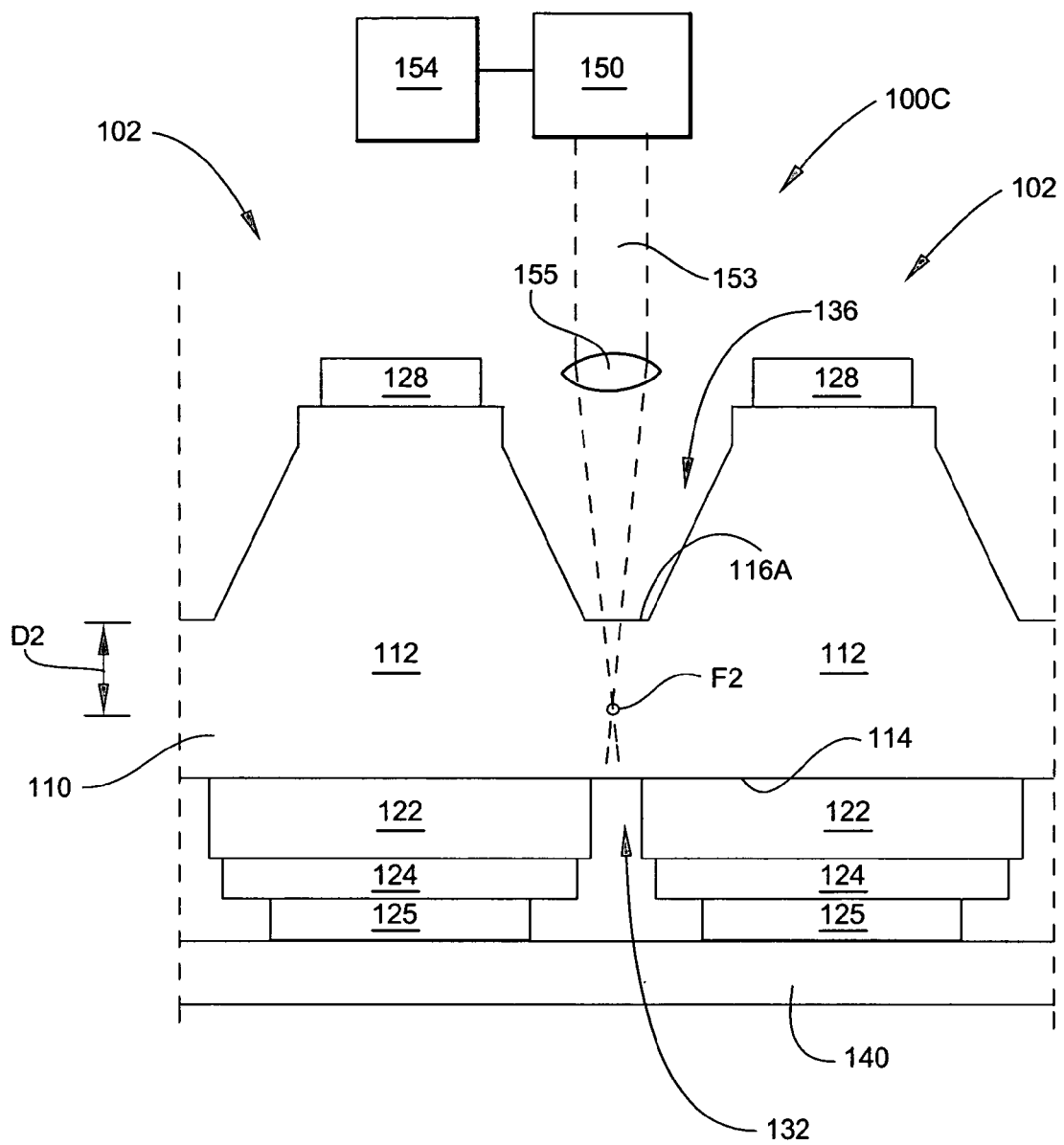
FIG. 8 is a schematic illustration of a portion of a substrate assembly, a laser, a laser beam, and a control apparatus according to embodiments of the present invention.
Figure 9:
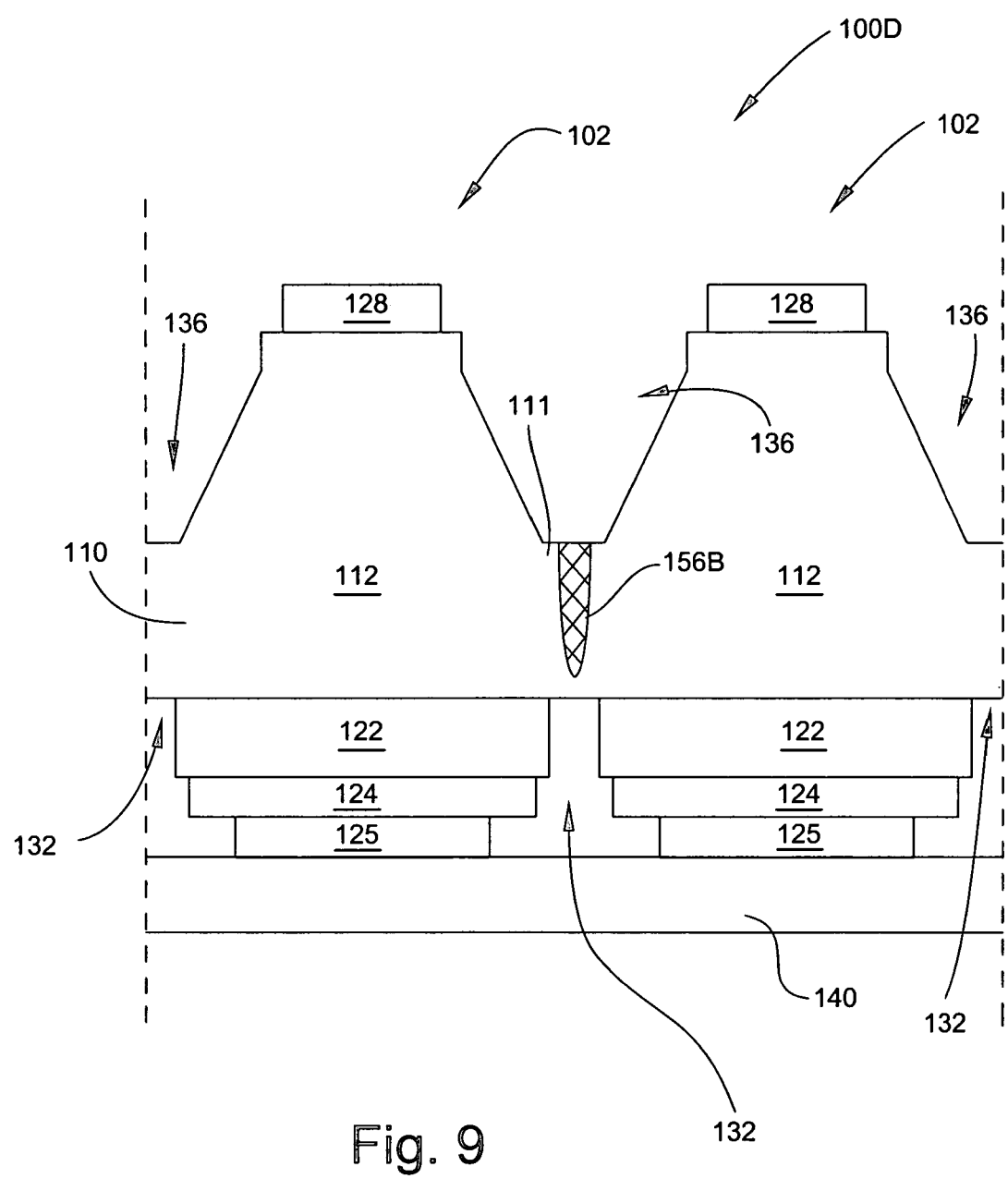
FIG. 9 is a schematic illustration of a portion of a further substrate assembly according to embodiments of the present invention.

With reference to FIGS. 7–9, alternative methods for singulating semiconductor devices will now be described. In accordance with such methods, steps of Block 50, Block 52, Block 54 and Block 56 (FIG. 7) are executed corresponding to the steps of Block 20, Block 22, Block 24 and Block 26, respectively, of the flow chart of FIG. 2. In this manner, the substrate assembly 100A as shown in FIG. 3 is formed. Thereafter, the substrate assembly 100A is shaped in the manner described above with regard to the step of Block 32 of FIG. 2 to form a substrate assembly 100C as shown in FIG. 8 (Block 60). The substrate assembly 100C thus formed includes shaping trenches 136 as discussed above and may be mounted on an adhesive surface 140 to facilitate the shaping and/or subsequent steps.

Following the shaping step, a beam of laser light 153 is directed into the substrate 110 from the shaped side of the substrate 110 through the shaping trenches 136 to create lines of TWZ 156B (FIG. 9) corresponding to the TWZ 156A therein, thereby creating the aforementioned break lines 164, 166 (Block 62) and forming a substrate assembly 100D shown in FIG. 9. The laser beam 153 is scanned (by relatively moving the laser 150, the substrate assembly 100C, or both) across the substrate 110 between the device portions 122 such that the laser beam 152 projects through and along each shaping trench 136. In this manner, the break lines 164, 166 may be formed in a pattern so as to be substantially coextensive and aligned with the streets 160, 162 as shown in FIG. 5. The control apparatus 154 may control the operation of the laser 150 and the relative movement between the laser beam 152 and the substrate assembly 100C.

During the above-described scanning operations, the laser beam 153 is generated such that its focus F2 is located within the substrate 110 between the surfaces 114, 116 as illustrated in FIG. 8. According to some embodiments, the depth of focus D2 (measured from the device side surface 116) of the laser beam 153 is substantially uniform across the width of the substrate 110.

According to some embodiments, ablation of the surface 116A is minimized to the extent feasible while providing sufficient TWZ to allow suitable weakening of the substrate 110. According to some embodiments, the TWZ 156B of the break lines 164, 166 is created while causing substantially no ablation of the substrate surface 116A. As discussed below, in accordance with further embodiments, some ablation of the surface 116A may be permitted or intended.

According to some embodiments, the depth of focus D2 of the laser beam 153 is selected to provide a depth of focus D1 relative to the surface 114A the same as described above with regard to the depth of focus of the laser beam 152 (i.e., T1−D2=D1).

In the foregoing alternative manner, the substrate assembly 100D (FIG. 9) is produced. The substrate assembly 100D may thereafter be singulated in the manner described above with reference to Block 34 of FIG. 2 (Block 64).

The dimensions and other aspects of the methods and substrate assembly 100B as discussed above may likewise apply to the methods of FIG. 7 and the substrate assembly 100D. The cross-sectional configuration and positioning of the TWZ 156B of the substrate assembly 100D may differ from that of the TWZ 156A of the substrate assembly 100B because the laser light is introduced from the opposite side.

According to further embodiments, an amount of ablation of the surface 114A or 116A is permitted or intended. That is, a portion of the surface may be fully ablated to provide surface ablation and a void or trench open to the surface. Such ablation may be provided to directly facilitate breaking of the substrate 110 and/or to allow for additional or more desirable location (e.g., depthwise) of the TWZ. Additionally or alternatively, such ablation may serve to form a trench for applying a passivation layer as disclosed in U.S. patent application Ser. No. 10/610,329, filed Jun. 30, 2003, titled TRENCH CUT LIGHT EMITTING DIODES AND METHODS OF FABRICATING SAME, the disclosure of which is incorporated herein by reference.

Figure 10:
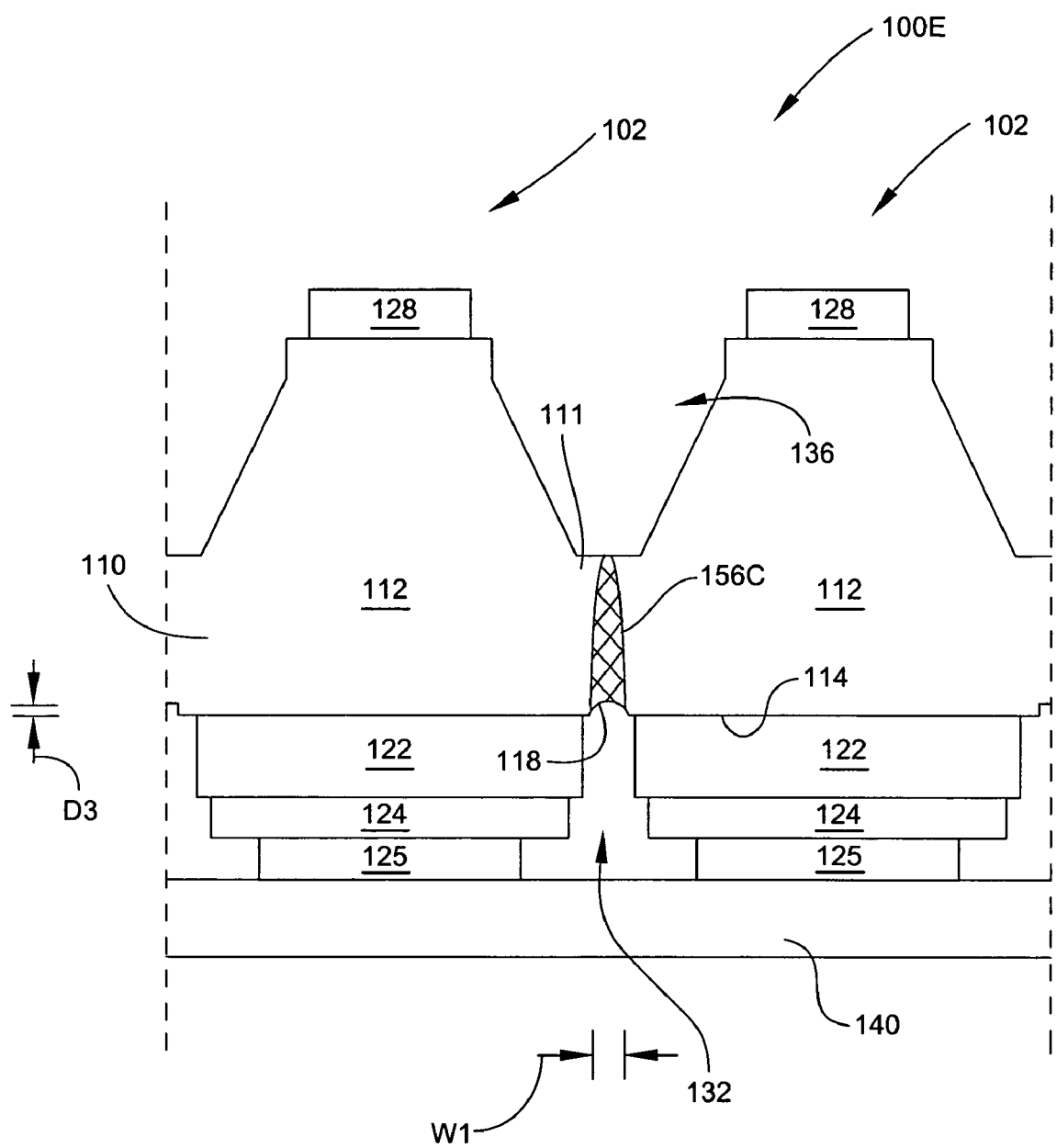
FIG. 10 is a schematic illustration of a portion of a substrate assembly according to embodiments of the present invention.

Referring to FIG. 10, a substrate assembly 100E according to embodiments of the invention is shown therein. The substrate assembly 100E may be formed in the manner described above with regard to FIG. 2, except that the laser 152 is operated so as to fully ablate the surface 114 to form an ablation trench 118 and a TWZ 156C corresponding to the TWZ 156A therein. The ablation trench 118 may be formed in a pattern so as to be substantially coextensive and aligned with the streets 160, 162 and the break lines 164, 166.

Figure 11:
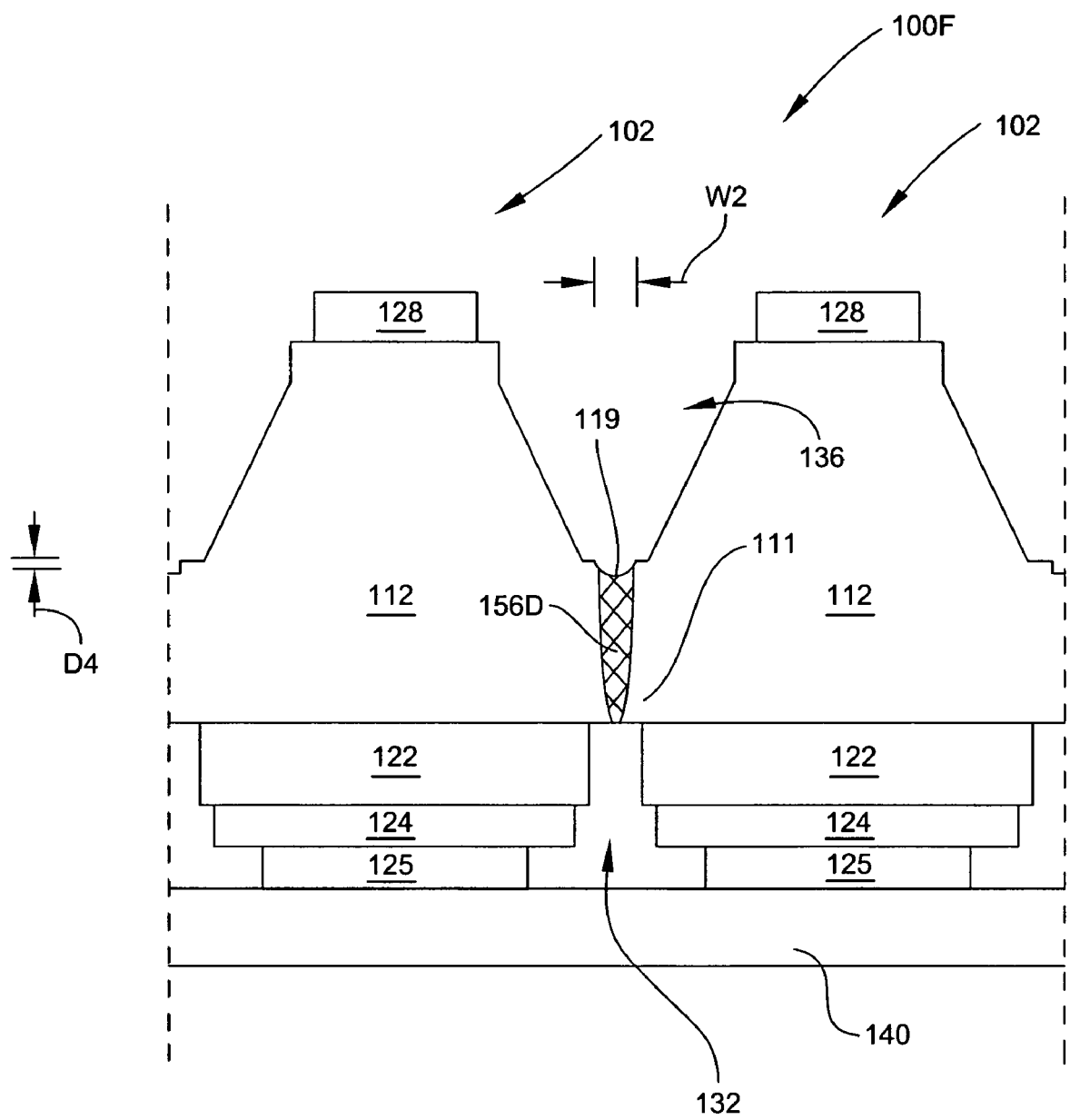
FIG. 11 is a schematic illustration of a portion of a substrate assembly according to embodiments of the present invention.

Referring to FIG. 11, a substrate assembly 100F according to further embodiments of the invention is shown therein. The substrate assembly 100F may be formed in the manner described above with regard to FIG. 7, except that the laser 153 is operated so as to fully ablate the surface 116 to form an ablation trench 119 and a TWZ 156D corresponding to the TWZ 156A therein. The ablation trench 119 may be formed in a pattern so as to be substantially coextensive and aligned with the streets 160, 162 and the break lines 164, 166.

According to some embodiments, the ablation trench 118 or 119 has a depth D3 or D4, respectively, into the substrate of no more than about 50 $\mu$m. According to more particular embodiments, the depth D3 or D4 is between about 5 and 50 $\mu$m. According to some embodiments, the depth D3 or D4 is no more than 99% of the thickness T1 of the connecting portions 111 of the substrate 110. According to more particular embodiments, the depth D3 or D4 is no more than 50% of the thickness T1. According to some embodiments, the ablation trench 118 or 119 has a width W1 or W2, respectively, perpendicular to the break line of no more than about 30 $\mu$m.

Any suitable laser may be used for the laser 150. Suitable lasers may include DPSS, Nd-YAG, $CO_2$, excimer, and/or other suitable lasers.

According to some embodiments, the beam of laser light 152, 153 has a full width at half maximum (FWHM) focus spot size of between about 5 and 25. According to some embodiments, the laser beam 152, 153 is pulsed at a rate of between about 10 and 50 kHz. According to more particular embodiments, the laser beam 152, 153 is pulsed at a rate of between about 20 and 40 kHz. According to some embodiments, the beam of laser light 152, 153 has a power of between about 0.8 and 5 W. While the methods as described above employ a beam of laser light 152 or 153, multiple laser beams may be employed simultaneously or successively.

The TWZ 156A–D may be characterized by the ratio of {the depth of the TWZ (e.g., the depth I of the TWZ 156A)} to {the maximum width of the TWZ (e.g., the width H of the TWZ 156A) within the surface of the substrate}. This ratio is referred to as the "TWZ aspect ratio". According to some embodiments, the TWZ aspect ratio is at least 1:1. According to some embodiments, the TWZ aspect ratio is between about 1:1 and 5:1 and, according to some embodiments, between about 2.25:1 and 5:1.

The break lines created by the laser may be characterized by the ratio of {the combined depth of the ablated trench (e.g., the trench 118 or the trench 119), if any, and the TWZ} to {the maximum width of the TWZ or the ablated trench whichever is greater}. This ratio is referred to as the "laser-affected aspect ratio". According to some embodiments, the laser-affected aspect ratio is at least 1:1. According to some embodiments, the laser-affected aspect ratio is between about 1:1 and 5:1 and, according to some embodiments, between about 2.25:1 and 5:1.

Methods and substrate assemblies in accordance with the present invention may provide a number of advantages over prior art singulation methods and substrate assemblies. The widths of the kerf or streets formed between the devices by saw or laser ablation limits the area of the wafer that may be devoted to the devices. By reducing or eliminating ablation, the street width may be reduced, thereby allowing for the formation of a greater density of devices on the substrate.

The sawing or laser ablating step of a scribe and break procedure in accordance with the prior art may generate debris or slag. In order to prevent or limit contamination of the devices, it may be necessary to shield the devices from the debris or slag or to provide a further step or steps for removing the debris or slag from the devices. By reducing or eliminating ablation in accordance with the present invention, the formation of slag or debris is commensurately reduced or prevented. Slag or debris contamination of the devices is thereby reduced so that the need for cleaning or protecting the devices may be eliminated or reduced.

Methods and substrate assemblies in accordance with the present invention may also provide an advantage over prior art singulation methods and substrate assemblies by providing a better defined and consistent break line and thereby facilitating more controlled crack propagation. In particular, the TWZ may reduce or eliminate the propagation of cracks transverse to the intended break lines that may typically occur when the substrate is singulated. Such unintended cracks may extend into and destroy an adjacent chip and/or may create contaminating debris. The break yield may be significantly improved. In particular, relatively high TWZ aspect ratios and laser-affected ratios may reduce die fly-off and other problems that may be encountered with other, surface ablative laser scribe and break methods.

The dimensions of the isolation trenches 132 and the shaping trenches 136 may depend upon the requirements of the devices 102 and the limitations of the apparatus and techniques employed for forming the trenches 132, 136. According to some embodiments, the isolation trench 132 has a nominal width W3 of no more than about 50 $\mu$m. According to some embodiments, the width W3 is between about 30 and 50 $\mu$m. According to some embodiments, the shaping trench 136 has a depth D5 (FIG. 4) into the substrate 120 of at least about 25 $\mu$m. According to some embodiments, the depth D5 is between about 200 and 225 $\mu$m. According to some embodiments, the shaping trench 136 has a nominal width W4 (FIG. 4) of at least 25 $\mu$m. According to some embodiments, the width W4 is between about 150 and 200 $\mu$m. According to some preferred embodiments, the shaping trench 136 has an aspect ratio (depth D5 to width W4) of between about 0.75:1 and 2.25:1. According to some embodiments, the depth D5 is between about 75 and 80% of the overall thickness T2 (FIG. 3) of the substrate 110.

As discussed above, according to some embodiments, the microelectronic substrate 110 is formed of SiC. It is also contemplated that aspects of the present invention may be employed with substrates formed of other materials such as gallium arsenide (GaAs), gallium phosphide (GaP), alloys thereof, and/or sapphire.

In certain embodiments of the present invention, the active device regions 122 may be gallium nitride-based LEDs or lasers fabricated on a silicon carbide substrate such as those devices manufactured and sold by Cree, Inc. of Durham, N.C. For example, the present invention may be suitable for use with LEDs and/or lasers as described in U.S. Pat. Nos. 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference as if set forth fully herein. Other suitable LEDs and/or lasers are described in U.S. Provisional Patent Application Ser. No. 60/294,378, entitled "LIGHT EMITTING DIDODE STRUCTURE WITH MULTI-QUANTUM WELL AND SUPERLATTICE STRUCTURE", U.S. Provisional Patent Application Ser. No. 60/294,445, entitled "MULTI-QUANTUM LIGHT EMITTING DIODE STRUCTURE" and U.S. patent application Ser. No. 10/140,796, entitled "LIGHT EMITTING DIDODE STRUCTURE WITH SUPERLATTICE STRUCTURE", each filed May 30, 2001, U.S. patent application Ser. No. 10/140,796, entitled "GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES", filed May 7, 2002, as well as U.S. Provisional Patent Application Ser. No. 60/307,235, entitled "LIGHT EMITTING DIODES INCLUDING SUBSTRATE MODIFICATIONS FOR LIGHT EXTRACTION AND MANUFACTURING METHODS THEREFOR", filed Jul. 23, 2001 and U.S. patent application Ser. No. 10/057,821, filed Jan. 25, 2002, entitled "LIGHT EMITTING DIODES INCLUDING SUBSTRATE MODIFICATIONS FOR LIGHT EXTRACTION AND MANUFACTURING METHODS THEREFOR", the disclosures of which are incorporated herein as if set forth fully.

In particular embodiments of the present invention, the light emitting devices may include a p-electrode that provides a reflecting layer to reflect light generated in the active region back through the device. Reflective p-electrodes and related structures are described in U.S. patent application Ser. No. 10/057,821, entitled "LIGHT EMITTING DIODES INCLUDING SUBSTRATE MODIFICATIONS FOR LIGHT EXTRACTION AND MANUFACTURING METHODS THEREFOR", filed Jan. 25, 2002, which is hereby incorporated by reference as if set forth fully herein.

The LEDs and/or lasers may be configured to operate in a "flip-chip" configuration such that light emission occurs through the substrate. In such embodiments, the substrate may be patterned so as to enhance light output of the devices as is described, for example, in U.S. Provisional Patent Application Ser. No. 60/307,235, filed Jul. 23, 2001, entitled "LIGHT EMITTING DIODES INCLUDING SUBSTRATE MODIFICATIONS FOR LIGHT EXTRACTION AND MANUFACTURING METHODS THEREFOR" and U.S. patent application Ser. No. 10/057,821, filed Jan. 25, 2002, entitled "LIGHT EMITTING DIODES INCLUDING SUBSTRATE MODIFICATIONS FOR LIGHT EXTRACTION AND MANUFACTURING METHODS THEREFOR."

The contacts (e.g., the contacts 124, 126) may be located on the same side of the respective substrate regions 112 (i.e., on the same side of the chip). Such chip configurations may allow and/or require modifications to the sequence of fabrication steps described herein.

While embodiments of the present invention have been described with reference to gallium nitride based devices, the teachings and benefits of the present invention may also be provided in other Group III nitrides or other semiconductor materials. Furthermore, while embodiments of the present invention have been described with reference to a shaped substrate having a cubic portion and a truncated pyramidal portion as illustrated in FIG. 4, other shapes of substrates may be utilized. Thus, embodiments of the present invention should not be construed as limited to the particular shapes described herein.

As mentioned above, in certain embodiments of the present invention, the light-emitting device may have a shaped substrate. Because of the high index of refraction of SiC, light passing through a SiC substrate tends to be totally internally reflected into the substrate at the surface of the substrate unless the light strikes the interface at a fairly low angle of incidence (i.e., fairly close to normal). The critical angle for total internal reflection depends on the material which forms the interface with the SiC substrate. It is possible to increase the light output from a SiC-based LED by shaping the SiC substrate in a manner that limits total internal reflection by causing more rays to strike the surface of the SiC at low angles of incidence. One such chip shaping technique and resulting chip is shown in U.S. patent application Ser. No. 10/057,821, filed Jan. 25, 2002, entitled "LIGHT EMITTING DIODES INCLUDING SUBSTRATE MODIFICATIONS FOR LIGHT EXTRACTION AND MANUFACTURING METHODS THEREFOR," which is hereby incorporated herein by reference.

While described with reference to LEDs and/or lasers, the methods and assemblies of the present invention may also be used for other devices that are singulated, such as diodes, transistors, thyristors or the like.

Figure 2:
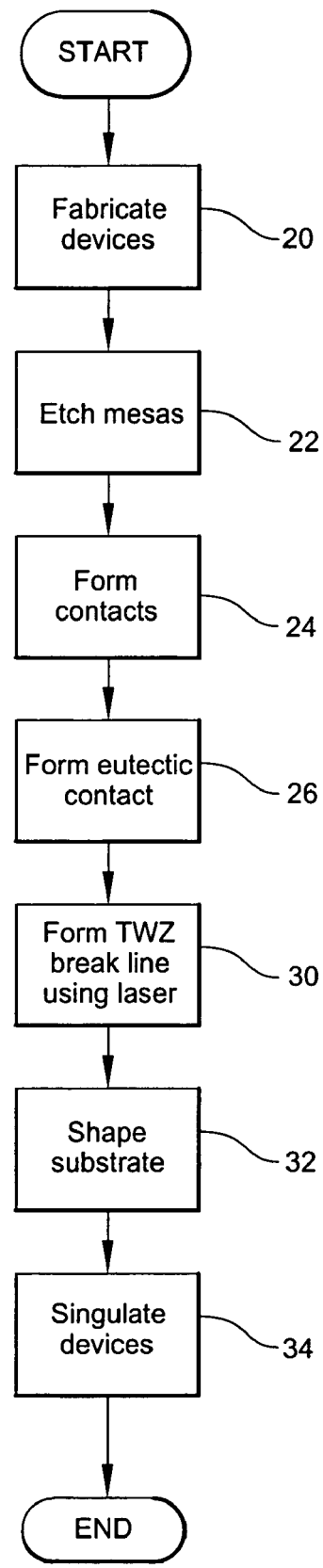
FIG. 2 is a further flow chart illustrating processing steps in the fabrication of devices according to embodiments of the present invention.

Furthermore, while operations for fabrication of devices are illustrated with reference to particular sequences in FIGS. 2 and 7, embodiments of the present invention should not be construed as limited to such sequences. For example, the TWZ 156A–D may be formed prior to forming the device layer, etching the mesas and forming some or all of the contacts. Thus, the present invention should not be construed as limited to the particular sequences of operations illustrated in FIGS. 2 and 7.

EXAMPLE 1

Figure 12:
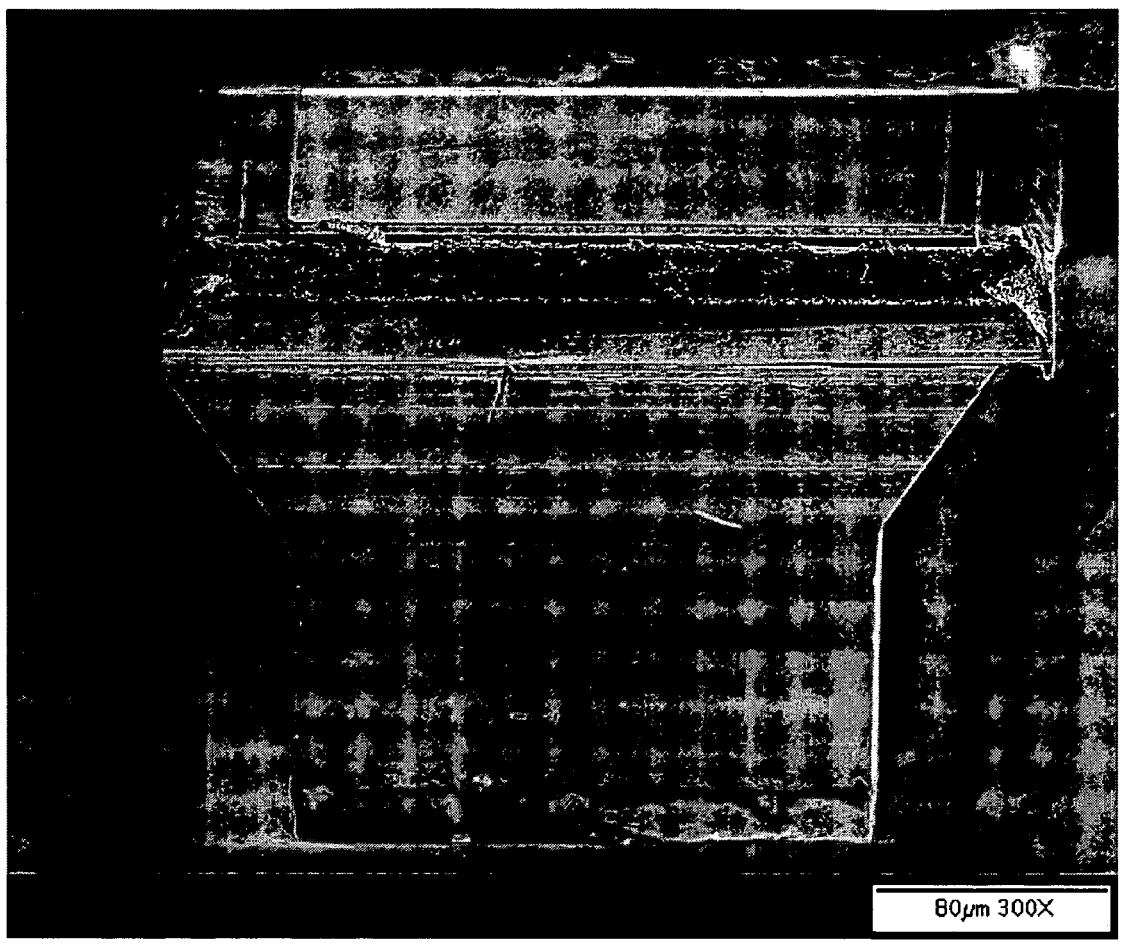
FIGS. 12 and 13 are photographs showing experimental results of a first scribing process.
Figure 13:
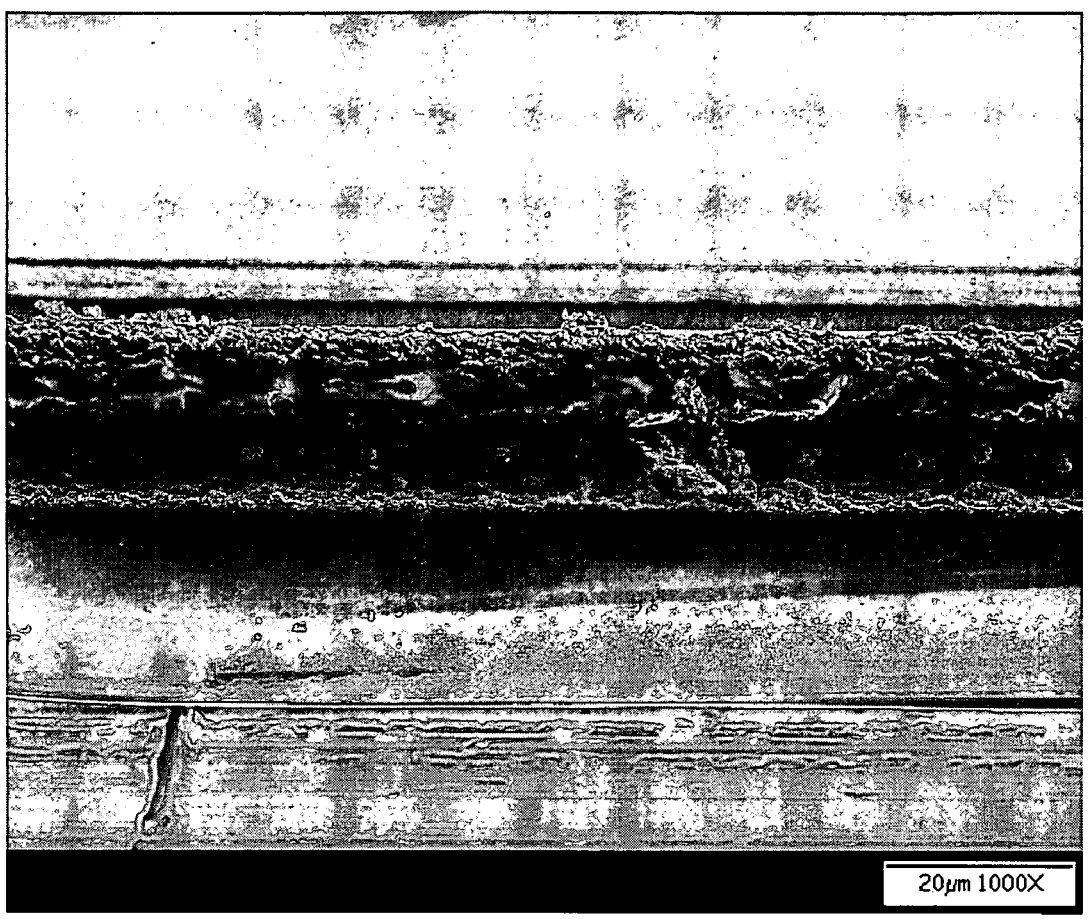

FIGS. 12 and 13 are photographs of a first SiC wafer that was laser scribed with a depth of focus of the laser at the surface of the wafer. The wafer had a thickness of 250 $\mu$m. The wafer material was 6H SiC with a pitch pattern of 300 $\mu$m square dice. The wafer was sawn to form the inverted pyramid shape from the back side. The laser energy was applied to the mesa or epitaxy side of the wafer and directed in the center of the "streets" (i.e., the non-active portions between the dice). The wafer was thereafter broken along the scribe lines using a Dynatex break tool. The edge formed along a break is shown in FIGS. 12 and 13 at magnifications of 300× and 1000×, respectively. The break yield for the first wafer was approximately 85%.

EXAMPLE 2

Figure 14:
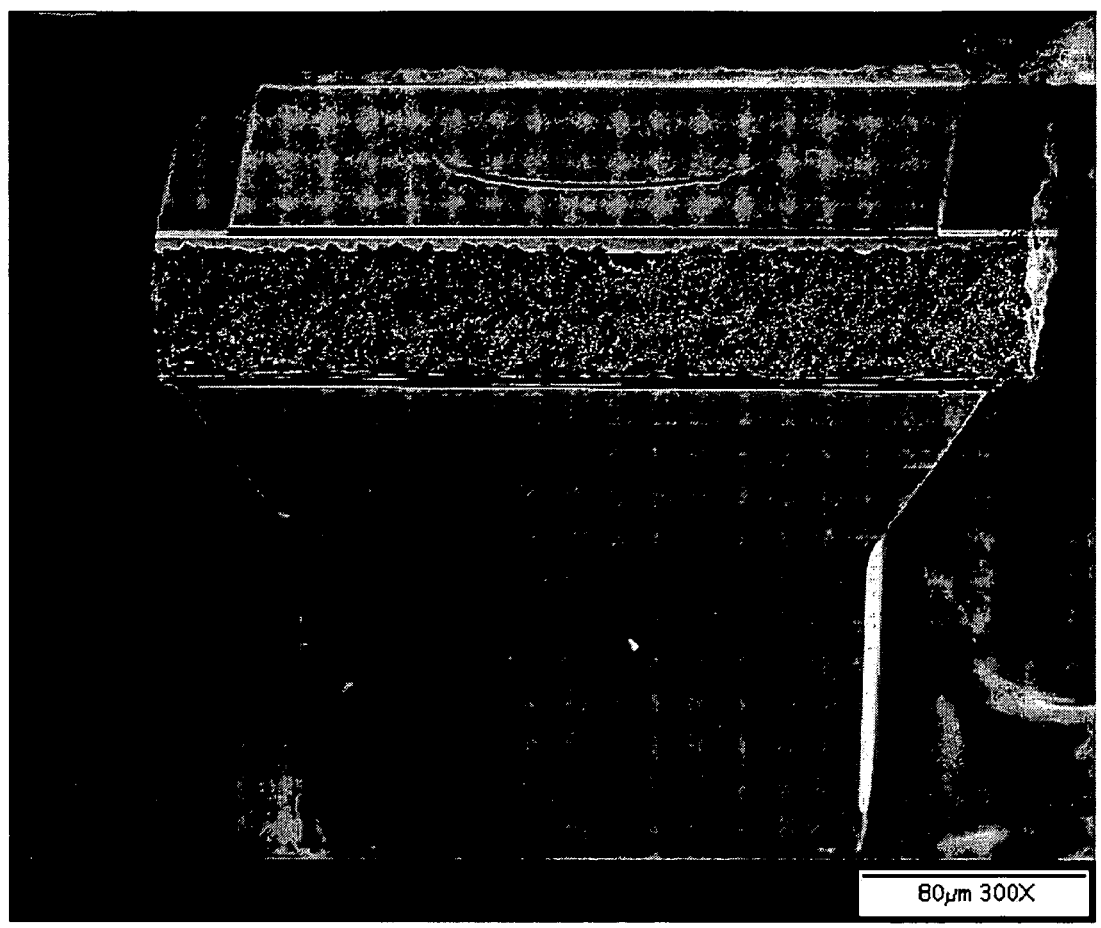
FIGS. 14 and 15 are photographs showing experimental results of a second scribing process according to embodiments of the present invention.
Figure 15:
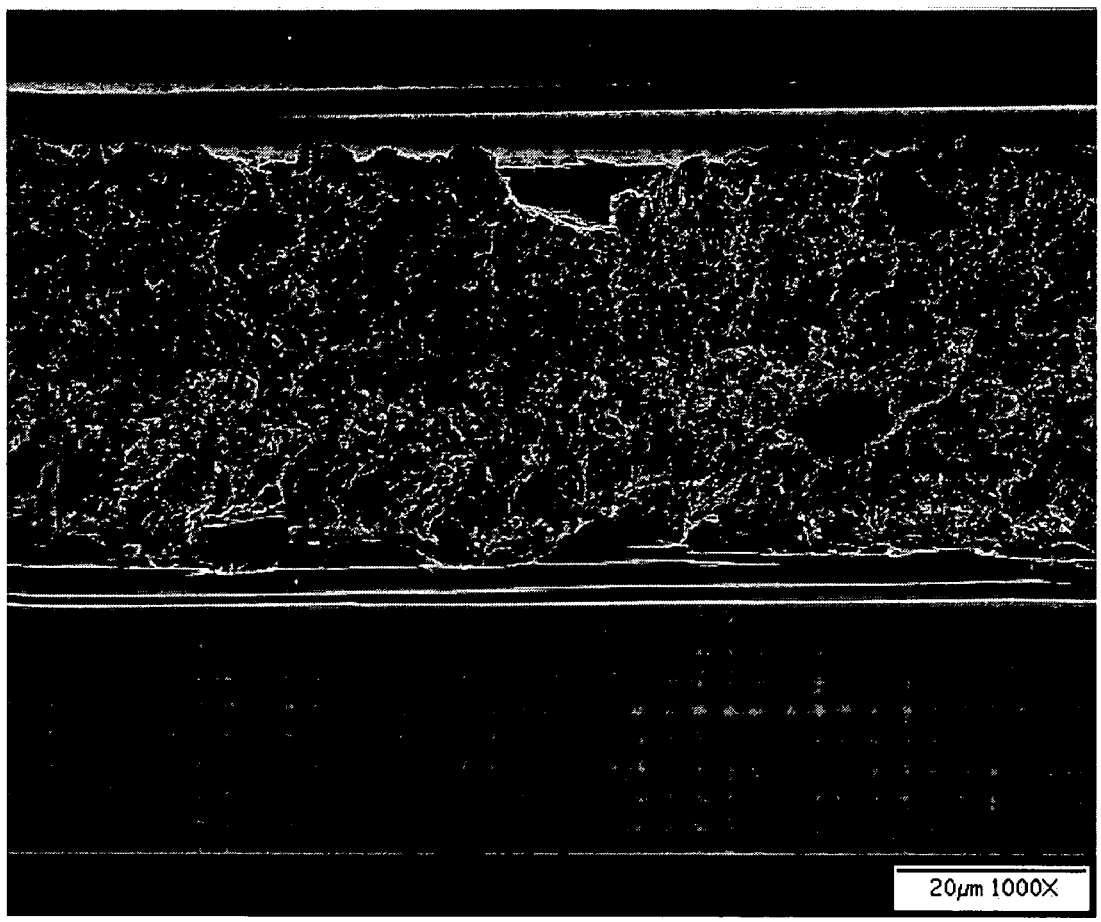

FIGS. 14 and 15 are photographs of a second SiC wafer that was laser scribed with a depth of focus of the laser at 10 $\mu$m below the surface of the wafer. The wafer had a thickness of 250 $\mu$m. The wafer material was 6H SiC with a pitch pattern of 300 $\mu$m square dice. The wafer was sawn to form the inverted pyramid shape from the back side. The laser energy was applied to the mesa or epitaxy side of the wafer and directed in the center of the "streets." The wafer was thereafter broken along the scribe lines using a Dynatex break tool. The edge formed along a break is shown in FIGS. 14 and 15 at magnifications of 300× and 1000×, respectively. Compared to the first wafer of Example 1, the second wafer of Example 2 has a more uniform and less rough break surface. The break yield for the second wafer was 100%.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A method for forming semiconductor devices using a semiconductor substrate having first and second opposed surfaces and including first and second device regions, the method comprising the step of:
directing a beam of laser light at the substrate such that the beam of laser light is focused within the substrate between the first and second surfaces thereof and the beam of laser light forms a thermally weakened zone (TWZ) in the substrate, the TWZ substantially formed by material conversion rather than by material ablation, the TWZ extending between the first and second device regions and defining a break line.

2. The method of claim 1 further comprising breaking the substrate along the break line to form first and second dice, the first die including the first device region of the substrate and the second die including the second device region of the substrate.

3. The method of claim 1 wherein the TWZ has a depth into a connecting portion of the substrate between the first and second device portions of at least 50% of a thickness of the connecting portion.

4. The method of claim 3 wherein the depth of the TWZ into the connecting portion is at least 95% of the thickness of the connecting portion.

5. The method of claim 1 wherein the step of directing the beam of laser light is conducted such that the beam of laser light causes substantially no surface ablation of the substrate.

6. The method of claim 1 wherein the step of directing the beam of laser light is conducted such that the beam of laser light forms a fully ablated ablation trench in at least one of the first and second surfaces of the substrate extending along the break line.

7. The method of claim 6 wherein the ratio of the combined depth of the ablation trench and the TWZ into the substrate to the greater of the maximum width of the TWZ and the maximum width of the ablation trench is at least 1:1.

8. The method of claim 6 wherein the step of directing the beam of laser light is conducted such that the ablation trench has a depth into the substrate of no more than about 50% of the thickness of a connecting portion of the substrate between the first and second device regions.

9. The method of claim 6 wherein the step of directing the beam of laser light is conducted such that the ablation trench has a depth into the substrate of no more than 50 $\mu$m.

10. The method of claim 9 wherein the step of directing the beam of laser light is conducted such that the ablation trench has a width perpendicular to the break line of no more than 30 $\mu$m.

11. The method of claim 1 wherein the step of directing the beam of laser light is conducted such that the TWZ has a TWZ depth into the substrate and a TWZ maximum width across the substrate, and the ratio of the TWZ depth to the TWZ maximum width is at least 1:1.

12. The method of claim 1 including forming at least one device layer on the first surface of the substrate, the at least one device layer including first and second device portions disposed on the first and second device regions, respectively.

13. The method of claim 12 wherein the step of forming the at least one device layer precedes the step of directing the beam of laser light.

14. The method of claim 12 further comprising breaking the substrate along the break line to form first and second dice, the first die including the first device region of the substrate and the first device portion, and the second die including the second device region of the substrate and the second device portion.

15. The method of claim 14 wherein the first and second dice include first and second light emitting diodes (LEDs), respectively.

16. The method of claim 14 wherein the first and second dice include first and second laser diodes, respectively.

17. The method of claim 12 further comprising forming an isolation trench in the at least one device layer, the isolation trench defining a first mesa including the first device portion and a second mesa including the second device portion.

18. The method of claim 17 wherein the step of directing the beam of laser light includes directing the beam of laser light into the substrate through the isolation trench.

19. The method of claim 17 wherein the step of forming the isolation trench includes etching the at least one device layer.

20. The method of claim 12 further comprising forming first and second contacts on the first and second device portions, respectively.

21. The method of claim 20 further comprising forming first and second eutectic metal contacts on each of the first and second contacts, respectively.

22. The method of claim 20 further comprising forming third and fourth contacts on the first side of the substrate opposite the first and second contacts, respectively.

23. The method of claim 12 wherein the at least one device layer includes a Group III nitride.

24. The method of claim 1 including forming a shaping trench in the second side of the substrate.

25. The method of claim 24 wherein the step of directing the beam of laser light includes directing the beam of laser light into the substrate through the shaping trench.

26. The method of claim 24 wherein the step of forming the shaping trench includes sawing the shaping trench into the second side of the substrate.

27. The method of claim 26 wherein the step of sawing the shaping trench includes forming the shaping trench such that the shaping trench is in the shape of a truncated pyramid with a cubic portion on top.

28. The method of claim 24 wherein the shaping trench has a depth in the substrate oft least about 25 $\mu$m.

29. The method of claim 28 wherein the shaping trench has a depth in the substrate of between about 200 and 225 $\mu$m.

30. The method of claim 24 wherein the step of forming the shaping trench includes forming the shaping trench such that the shaping trench is substantially parallel to the break line.

31. The method of claim 30 wherein the step of forming the shaping trench includes forming the shaping trench such that the shaping trench is substantially aligned with the break line.

32. The method of claim 1 wherein the substrate is formed of SiC.

33. A semiconductor substrate assembly comprising:
a) a semiconductor substrate having first and second opposed surfaces and including first and second device regions and a connecting portion extending between and joining the first and second device regions;
b) a thermally weakened zone (TWZ) within the connecting portion and between the first and second surfaces, the TWZ substantially formed by material conversion rather than by material ablation, the TWZ extending between the first and second device regions and defining a break line; and
c) a fully ablated ablation trench defined in a surface of the substrate and extending along the break line;
d) wherein the first and second device regions are separable to form first and second dice by breaking the substrate along the break line; and
e) wherein the TWZ has a depth into the connecting portion of at least 50% of a thickness of the connecting portion.

34. The assembly of claim 33 wherein the depth of the TWZ into the connecting portion is at least 95% of the thickness of the connecting portion.

35. A semiconductor substrate assembly comprising:
a) a semiconductor substrate having first and second opposed surfaces and including first and second device regions and a connecting portion extending between and joining the first and second device regions;
b) a thermally weakened zone (TWZ) within the connecting portion and between the first and second surfaces, the TWZ substantially formed by material conversion rather than by material ablation, the TWZ extending between the first and second device regions and defining a break line; and
c) a shaping trench in the second side of the substrate;
d) wherein the first and second device regions are separable to form first and second dice by breaking the substrate along the break line; and
e) wherein the TWZ has a depth into the connecting portion of at least 50% of a thickness of the connecting portion.

36. The assembly of claim 33 wherein the ablation trench has a depth into the connecting portion of no more than 50% of the thickness of the connecting portion.

37. The assembly of claim 33 wherein the ablation trench has a depth into the substrate of no more than 50 $\mu$m.

38. The assembly of claim 33 wherein the ablation trench has a width perpendicular to the break line of no more than 30 $\mu$m.

39. The assembly of claim 33 including at least one device layer on the first surface of the substrate, the at least one device layer including first and second device portions disposed on the first and second device regions, respectively.

40. The assembly of claim 39 configured such that, when the assembly is separated along the break line to form the first and second dice, the first die includes the first device region of the substrate and the first device portion, and the second die includes the second device region of the substrate and the second device portion.

41. The assembly of claim 40 configured such that, when the assembly is separated along the break line to form the first and second dice, the first and second dice include first and second light emitting diodes (LEDs), respectively.

42. The assembly of claim 40 configured such that, when the assembly is separated along the break line to form the first and second dice, the first and second dice include first and second laser diodes, respectively.

43. A semiconductor substrate assembly comprising;
a) a semiconductor substrate having first and second opposed surfaces and including first and second device regions and a connecting portion extending between and joining the first and second device regions;

b) a thermally weakened zone (TWZ) within the connecting portion and between the first and second surfaces, the TWZ substantially formed by material conversion rather than by material ablation, the TWZ extending between the first and second device regions and defining a break line;

c) at least one device layer on the first surface of the substrate, the at least one device layer including first and second device portions disposed on the first and second device regions, respectively; and an isolation trench in the at least one device layer, the isolation trench defining a first mesa including the first device portion and a second mesa including the second device portion;

e) wherein the first and second device regions are separable to form first and second dice by breaking the substrate along the break line; and f) wherein the TWZ has a depth into the connecting portion of at least 50% of a thickness of the connecting portion.

44. The assembly of claim 33 including first and second contacts on the first and second device portions, respectively.

45. The assembly of claim 44 including first and second eutectic metal contacts on each of the first and second contacts, respectively.

46. The assembly of claim 44 including third and fourth contacts on the first side of the substrate opposite the first and second contacts, respectively.

47. The assembly of claim 33 wherein the at least one device layer includes a Group III nitride.

48. The assembly of claim 35 wherein each of the first and second surfaces of the substrate is substantially non-surface ablated.

49. The assembly of claim 48 wherein the shaping trench is in the shape of a truncated pyramid with a cubic portion on top.

50. The assembly of claim 48 wherein the shaping trench has a depth in the substrate of at least about 25 $\mu$m.

51. The assembly of claim 50 wherein the shaping trench has a depth in the substrate of between about 200 and 225 $\mu$m.

52. The assembly of claim 48 wherein the shaping trench is substantially parallel to the break line.

53. The assembly of claim 52 wherein the shaping trench is substantially aligned with the break line.

54. The assembly of claim 33 wherein the substrate is formed of SiC.

55. A semiconductor substrate assembly comprising a) a semiconductor substrate having first and second opposed surfaces and including first and second device regions;

b) a thermally weakened zone (TWZ) within the substrate between the first and second surfaces, the TWZ substantially formed by material conversion rather than by material ablation, the TWZ extending between the first and second device regions and defining a break line; and c) a fully ablated ablation trench defined in a surface of the substrate and extending along the break line;

d) wherein the ratio of the combined depth of the ablation trench and the TWZ into the substrate to the greater of the maximum width of the TWZ and the maximum width of the ablation trench is at least 1:1; and e) wherein the first and second device regions are separable to form first and second dice by breaking the substrate along the break line.

56. The assembly of claim 55 wherein the substrate is formed of SiC.

57. A semiconductor substrate assembly comprising:

a) a semiconductor substrate having first and second opposed surfaces and including first and second device regions;

b) a thermally weakened zone (TWZ) within the substrate between the first and second surfaces, the TWZ substantially formed by material conversion rather than by material ablation, the TWZ extending between the first and second device regions and defining a break line; and c) a fully ablated ablation trench defined in a surface of the substrate and extending along the break line;

d) wherein the TWZ has a TWZ depth into the substrate and a TWZ maximum width across the substrate, and the ratio of the TWZ depth to the TWZ maximum width is at least 1:1; and e) wherein the first and second device regions are separable to form first and second dice by breaking the substrate along the break line.

58. The assembly of claim 57 wherein the substrate is formed of SiC.

59. A semiconductor substrate assembly comprising:

a) a semiconductor substrate having first and second opposed surfaces and including first and second device regions;

b) a thermally weakened zone (TWZ) within the substrate between the first and second surfaces, the TWZ substantially formed by material conversion rather than by material ablation, the TWZ extending between the first and second device regions and defining a break line;

c) at least one device layer on the first surface of the substrate, the at least one device layer including first and second device portions disposed on the first and second device regions, respectively; and d) an isolation trench in the at least one device layer, the isolation trench defining a first mesa including the first device portion and a second mesa including the second device portion;

e) wherein the TWZ has a TWZ depth into the substrate and a TWZ maximum width across the substrate, and the ratio of the TWZ depth to the TWZ maximum width is at least 1:1; and f) wherein the first and second device regions are separable to form first and second dice by breaking the substrate along the break line.

60. A semiconductor substrate assembly comprising:

a) a semiconductor substrate having first and second opposed surfaces and including first and second device regions;

b) a thermally weakened zone (TWZ) within the substrate between the first and second surfaces, the TWZ substantially formed by material conversion rather than by material ablation, the TWZ extending between the first and second device regions and defining a break line; and c) a shaping trench in the second side of the substrate;

d) wherein the TWZ has a TWZ depth into the substrate and a TWZ maximum width across the substrate, and the ratio of the TWZ depth to the TWZ maximum width is at least 1:1; and e) wherein the first and second device regions are separable to form first and second dice by breaking the substrate along the break line.

* * * * *

UNITED STATES PATENT AND TRADEMARK OFFICE
CERTIFICATE OF CORRECTION

PATENT NO. : 7,008,861 B2  Page 1 of 1
APPLICATION NO. : 10/733845
DATED : March 7, 2006
INVENTOR(S) : Andrews et al.

It is certified that error appears in the above-identified patent and that said Letters Patent is hereby corrected as shown below:

<u>Column 13,</u>
Line 50 should read -- has a depth in the substrate of at least about 25 µm. --

<u>Column 15,</u>
Line 13 should read -- d) an isolation trench in the at least one device layer, the --

Line 37 should read -- 49. The assembly of claim 35 wherein the shaping trench --

Line 40 should read -- 50. The assembly of claim 35 wherein the shaping trench --

Line 45 should read -- 52. The assembly of claim 35 wherein the shaping trench --

Signed and Sealed this

Eighth Day of August, 2006

JON W. DUDAS
*Director of the United States Patent and Trademark Office*